United States Patent [19]

Sonobe

[11] Patent Number: 5,103,255
[45] Date of Patent: Apr. 7, 1992

[54] IMAGE RECORDING APPARATUS FOR INHIBITING THE DETERIORATION OF PHOTOSENSITIVE RECORDING MEDIUM

[75] Inventor: Katusyoshi Sonobe, Nagoya, Japan

[73] Assignee: Brother Kogyo Kabushiki Kaisha, Japan

[21] Appl. No.: 595,405

[22] Filed: Oct. 11, 1990

[30] Foreign Application Priority Data

Oct. 31, 1989 [JP] Japan .................................. 1-285314

[51] Int. Cl.⁵ ............................................. G08B 27/32
[52] U.S. Cl. ......................................... 355/27; 355/72
[58] Field of Search ..................... 355/27, 28, 32, 72; 354/173.1, 173.11; 430/138

[56] References Cited

U.S. PATENT DOCUMENTS

| | | | |
|---|---|---|---|
| 4,399,209 | 8/1983 | Sanders et al. | 430/138 |
| 4,801,976 | 1/1989 | Hayashi | 355/28 |
| 4,901,103 | 2/1990 | Hayakama | 355/27 |
| 4,903,070 | 2/1990 | Nakata et al. | 355/27 |
| 4,935,769 | 6/1990 | Ogura | 355/27 |

Primary Examiner—Brian W. Brown
Assistant Examiner—Khanh Dang
Attorney, Agent, or Firm—Oliff & Berridge

[57] ABSTRACT

An image recording apparatus for recording images on a continuous form photosensitive recording medium is disclosed. The apparatus comprises a cartridge for accommodating the photosensitive recording medium therein including a peripheral wall for blocking the flow of air into and out of the cartridge, a support for supporting unused (unexposed) photosensitive recording medium in the cartridge, and an outlet located in the peripheral wall for drawing the photosensitive recording medium into and out of the cartridge. The apparatus also includes a feeding device which is controlled to feed unused (unexposed) photosensitive recording medium which has been drawn out of the cartridge back toward the outlet of the cartridge to place this unused photosensitive recording medium inside the cartridge. The feeding device is actuated when a detecting device detects at least one of the expiration of a predetermined time period since a previous image was recorded and the switching-off of the power to the image recording machine. Thus, the image recording apparatus prevents the unused photosensitive recording medium from deteriorating due to the influence of high temperature and high moisture which may be present in the air surrounding the cartridge.

19 Claims, 6 Drawing Sheets

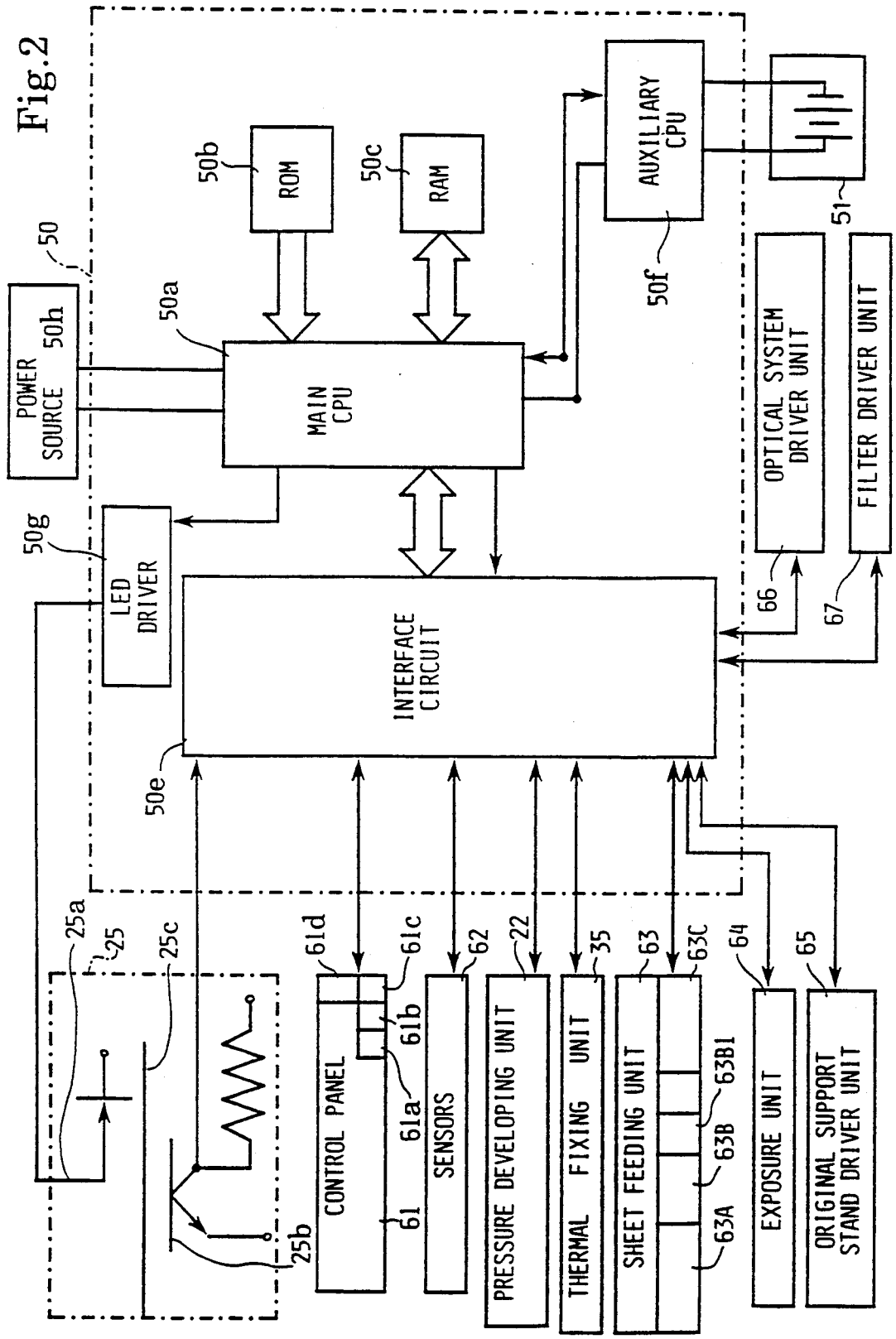

Fig.3B

| ITEM | INSTRUCTION |
|---|---|
| S100 | IS THE COPYING OPERATION ENDED? |
| S110 | IS THE MAIN POWER SWITCHED OFF? |
| S120 | MOVE PRESSURE DEVELOPING ROLLERS 22A AND 22B APART. |
| S130 | FEED UNUSED PHOTOSENSITIVE SHEET INTO CARTRIDGE. |
| S140 | STORE DATA RELATING TO END OF COPY OPERATION IN ROM. |
| S150 | MEASURE TIME PERIOD BETWEEN END OF COPYING OPERATION AND CURRENT TIME. |
| S160 | IS THE MAIN POWER SWITCHED OFF? |
| S170 | IS THE TIME PERIOD MEASURED IN S150 EQUAL TO THE PREDETERMINED TIME PERIOD? |
| S180 | MOVE PRESSURE DEVELOPING ROLLERS 22A AND 22B APART. |
| S190 | FEED UNUSED PHOTOSENSITIVE SHEET INTO CARTRIDGE. |

IMAGE RECORDING APPARATUS FOR INHIBITING THE DETERIORATION OF PHOTOSENSITIVE RECORDING MEDIUM

Cross-reference is made to the following copending applications of the same assignee which are filed concurrently herewith and disclose the same basic image recording system: U.S. Pat. application Ser. No. 07/595,411 filed Oct. 11, 1990 to Katsuyoshi Sonore et al an entitled "Image Recording Apparatus Which Discharges An Output Image Sheet Upon Completion Of Photosensitive Recording Medium Adjustment"; U.S. Pat. Application Ser. No. 07,596,017 filed Oct. 11, 1990 to Masanori Kobayashi et al and entitled "Image Recording Apparatus Which Prohibits Starting Of A Recording Operation Until Completion Of Photosensitive Recording Medium Adjustment"; and U.S. Pat. Application Ser. No. 07/595,850, filed Oct. 11, 1990 to Shin Asai and entitled "Image Recording Apparatus Which Reduces The Wasting Of Photosensitive Recording Medium When Operating In A Plural Image Recording Mode". The above-listed applications are herein incorporated by reference.

BACKGROUND OF THE INVENTION

1. Field of the Invention

The present invention relates to an image recording apparatus such as a copying machine or a printer in which a photosensitive recording medium is employed, and more particularly to such an image recording apparatus that prevents unused photosensitive recording medium from deteriorating due to the influence of high temperature and high moisture in the air.

2. Discussion of the Related Art

Generally, an image recording apparatus which uses a photosensitive recording medium employs, for example, as disclosed in U.S. Pat. No. 4,903,070, the disclosure of which is herein incorporated by reference, an elongated web-like microcapsule sheet coated with a plurality of photo and pressure sensitive microcapsules, each microcapsule enveloping therein a chromogenic material and a photosensitive resin, and a developer sheet coated with developing material which produces an output image upon reaction with the chromogenic material, as is well known in the art.

The image recording apparatus comprises means for receiving the elongated web-like microcapsule sheet wound around a cartridge shaft and retained in a cartridge, an exposing unit for exposing the microcapsule sheet disposed at an exposure table to form a latent image thereon, a developer sheet feeding unit for feeding a developer sheet from a developer sheet cassette, which stores therein, for example, a stack of developer sheets, toward an exposed microcapsule sheet, a pressure developing unit for pressurizing the exposed microcapsule sheet superposed with the developer sheet to thereby form an output image on the developer sheet, a separating unit for separating the exposed microcapsule sheet from the developer sheet, a taking-up unit for taking-up the separated microcapsule sheet, and a thermal fixing unit for fixing the output image on the developer sheet.

In this type of image recording apparatus, the elongated microcapsule sheet drawn out of the cartridge passes through the exposing unit, the pressure developing unit and the separating unit, and is taken up by a taking up unit. The developer sheet and superposed elongated microcapsule sheet containing a latent image are pressurized by the pressure developing unit, and are separated from each other by the separating unit and then the developer sheet is subjected to thermal fixing in the thermal fixing unit. At this time, the copying operation is completed.

In this type of conventional image recording apparatus, if a copying operation has not been executed for a long time, the unused (unexposed) microcapsule sheet which has nonetheless been drawn out of the cartridge is exposed to air located within the frame of the recording apparatus. Thus, the unused microcapsule sheet is threatened with deterioration due to the influence of high temperature and high moisture in the air within the frame, which causes a failure to reproduce the desired image.

OBJECTS AND SUMMARY OF THE INVENTION

It is therefore, an object of the present invention to overcome the above described drawbacks and disadvantages, and to provide an image recording apparatus that prevents the unused photosensitive recording medium from deteriorating due to the influence of high temperature and high moisture in the air located within a frame of the image recording apparatus external to the microcapsule sheet containing cartridge.

To attain this and other objects, according to the present invention, there is provided an image recording apparatus for recording an image on a photosensitive recording medium comprising: a cartridge for accommodating the photosensitive recording medium including a peripheral wall for blocking the passage of air into and out of the cartridge, supporting means for supporting the unused photosensitive recording medium, and an outlet in the peripheral wall for drawing the photosensitive recording medium out of the cartridge, a feeding means for feeding unused photosensitive recording medium which has been drawn out of the cartridge back toward the outlet of the cartridge so as to accommodate (relocate) the unused photosensitive recording medium which has been previously drawn from the cartridge back inside of the cartridge, detecting means for detecting at least one of the expiration of a predetermined time period since a previous copy has been made and the switching-off of the power to the image recording apparatus, feeding controlling means for controlling the feeding means to feed the unused photosensitive recording medium which has previously been drawn out of the cartridge back into the cartridge based on the detection made by said detecting means.

In the image recording device of the invention constructed above, if the detecting means detects at least one of the expiration of the predetermined time period and the switching-off of the power to the image recording machine, the feeding controlling means controls the feeding means to accommodate the unused photosensitive recording medium which has been previously drawn from the cartridge back into the cartridge.

Therefore the unused photosensitive recording medium is accommodated in the cartridge which blocks the air located externally of the cartridge from contacting the photosensitive recording medium therein which is thereby prevented from deteriorating due to the influence of high temperature and high moisture in that air.

BRIEF DESCRIPTION OF THE DRAWINGS

The foregoing and other objects, features and advantages of the present invention will become more apparent by reading the following detailed description of a presently preferred embodiment of the invention, when considered in connection with the accompanying drawings, in which:

FIG. 2 is a block diagram showing a controller which includes a control circuit;

FIGS. 3A and 3B are a flow chart and table, respectively, showing a processing procedure of the controller;

DETAILED DESCRIPTION OF THE PREFERRED EMBODIMENT

One preferred embodiment according to the present invention is shown in FIGS. 1-5.

Figure 1:
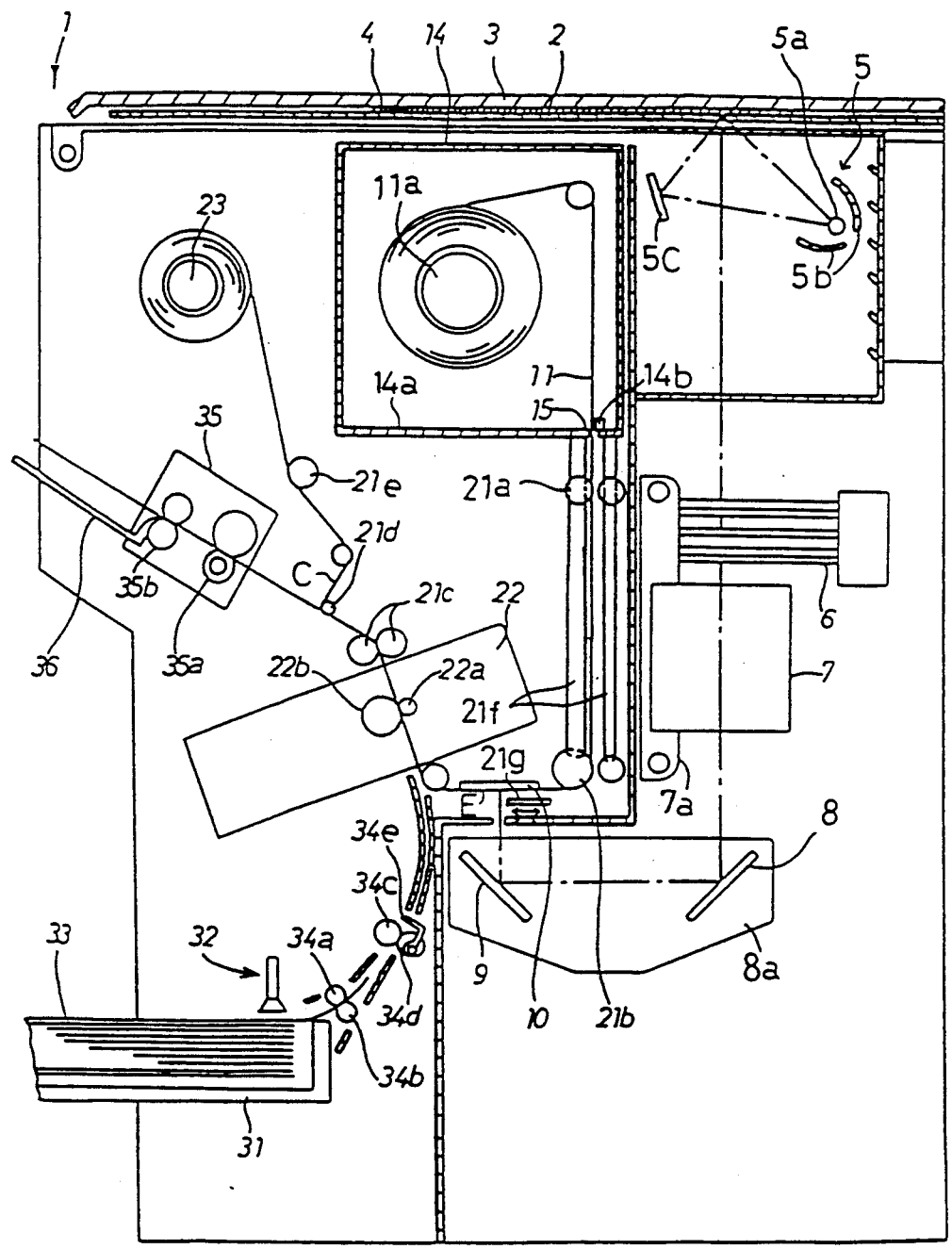
FIG. 1 is a schematic elevational view in cross section of one embodiment of an image recording apparatus of the present invention.

FIG. 1 schematically shows a copying machine according to an embodiment of the disclosed invention. The illustrated copying machine, generally indicated at 1, is a photosensitive pressure-sensitive copying machine capable of copying and producing full-color images.

The photosensitive recording medium is of a transfer type recording medium which comprises a photosensitive recording medium and a developer recording medium. More specifically, The photosensitive recording medium comprises a photosensitive pressure sensitive recording sheet provided with microcapsules which encapsulate therein a first material (chromogenic material or dye precursor) having first and second phases dependent on light exposure. The developer recording medium comprises the developer recording sheet coated on a substrate with a second material (developer material) which provides an output image upon reaction with the first material. Such an image recording medium is disclosed in, for example, U.S. Pat. No. 4,399,209 and Japanese Patent Application Kokai No. 58-88739.

The copying machine employs a continuous photosensitive pressure-sensitive recording sheet such as a microcapsule sheet 11 for recording a latent image thereon, and a developer sheet 33 for receiving a developed color image from the microcapsule sheet 11.

The copying machine 1 includes an upper panel assembly having an original support stand glass 2 which is movable back and forth and an original support stand glass cover 3 that can be placed over the original support stand glass 2. An original 4 to be copied is put on the original support stand glass 2, which is formed of light transmissive material. The copying machine 1 also has a light source 5 placed in an upper righthand portion thereof below the original support stand glass 2. The light source 5 comprises a halogen lamp 5a extending in a direction normal to the direction in which the original support stand glass 2 is movable back and forth, and semicylindrical reflecting mirrors 5b disposed in surrounding relation to the halogen lamp 5a. The light source 5 emits a linear-line of light toward the lower surface of the original support stand glass 2.

When the original support glass 2 moves, the light emitted from the halogen lamp 5a sequentially irradiates the entire surface of the original support stand glass 2 from the lefthand to the righthand end thereof (as viewed in FIG. 1). The light from the light source 5 passes through the transparent original support stand glass 2, and is then reflected by the original 4 placed on the original support stand glass 2. The original support stand glass cover 3 covers the entire upper surface of the original support stand glass 2 so that the light applied to the original support stand 2 will not leak out from those areas of the original support stand glass 2 which are not covered by the original 4.

A reflector 5c is positioned on the left-hand side of the light source 5 for applying light emitted from halogen lamp 5a to the original in a highly efficient manner. Reflector 5b reflects light emitted from lamp 5a which is not initially directed toward the original support glass 2.

The light reflected from the original 4 on the original support stand glass 2 is directed downwardly and passes through a filter 6 and a lens 7. The filter 6 serves to pass desired wavelengths of light dependent on the sensitivity of a microcapsule sheet 11 for adjusting the colors of a copied image. The lens 7 is mounted on a lens attachment 7a which is slightly adjustable with respect to the path of the light through the filter 6 and the lens 7.

The light converged by the lens 7 is directed 180 degrees by two reflecting mirrors 8, 9 and then focused on the microcapsule sheet 11 held closely against the lower surface of an exposure table 10. The reflecting mirrors 8, 9 are mounted on a mirror attachment 8a which is slightly positionally adjustable to vary the length of the light path for focusing.

The microcapsule sheet 11 is of a continuously elongated length and is wound around a cartridge reel 11a. Cartridge reel 11a functions as supporting means for supporting photosensitive recording medium in the cartridge. The wound microcapsule sheet 11 is placed in a removable cartridge 14 positioned below the original support stand glass 2. The cartridge 14 has peripheral walls 14a composed of heat insulating material for sheltering the compartment defined by walls 14a from high temperature and moisture external to cartridge 14. Cartridge 14 also includes a reel 11a for holding the rolled-up unused microcapsule sheet 11, and an outlet 15 for drawing the leading edge of the microcapsule sheet 11 therefrom. An air-shielding medium or sealing means 14b, which is formed of a material which essentially seals outlet 15 for preventing heat and moisture from entering cartridge 14 and which also does not damage the photosensitive sheet 11 as it passes through outlet 15, is provided at outlet 15. Air shielding medium 14b prevents air located external to cartridge 14, and potentially having a high moisture content, from entering cartridge 14 through outlet 15. Some examples of material which can be used as sealing means 14b for sealing outlet 15 include cork, fabric, rubber flaps, etc. Additionally, a mechanism can be provided for moving sealing means 14b into and out of outlet 15 to seal outlet 15 when the photosensitive sheet is not being conveyed therethrough or to open outlet 15 for passage of photosensitive recording medium therethrough. The leading edge portion of the microcapsule sheet 11 is provided with a leader consisting of a suitable sheet fixed to the leading edge of the photosensitive sheet material. The leader extends toward and is attached to a take-up reel 23 after passing through many rollers 21a, 21b, 21c, the pressure developing unit 22 and the separator roller 22d described below.

As shown in FIG. 1, the microcapsule sheet 11 which has been drawn out of the outlet 15 of the cartridge 14 is fed and guided by a feed roller 21a and a guide roller 21b, and extends beneath exposure table 10 into the pressure developing unit 22. The microcapsule sheet 11 which has passed through the pressure developing unit 22 is fed by a pair of feed rollers 21c, travels past a separator roller 21d and an adjustment roller 21e, and is then wound around the take-up reel 23. The microcapsule sheet 11 discharged from cartridge 14 is prevented from being prematurely exposed by a light-shielding cover 21f prior to reaching the exposure table 10.

An additional light shielding cover 21g is disposed below the exposure table 10 so that the microcapsule sheet 11 is not further exposed after having a latent image formed thereon by light reflected by the original 4. The light shielding cover 21g is connected with a driving mechanism (not shown) which moves the light shielding cover 21g rightward and leftward as shown in FIG.1.

The speed at which the microcapsule sheet 11 is fed in an exposing operation is controlled so as to be held at a constant level, and remains the same speed at which the original support stand glass 2 is moved. Therefore, a latent image can be formed successively line by line on the microcapsule sheet 11 when it moves past the exposure table 10.

A developer sheet cassette 31 storing a stack of cut-sheet type developer sheets 33 is disposed below the pressure developing unit 22. The developer sheets 33 are taken out of cassette 31 one at a time by a sheet feed mechanism 32 which attracts the developer sheets 33 with suction. Each developer sheet 33 which is taken from cassette 31 is further conveyed by a feed roller 34a and a pinch roller 34b. After the leading end of the developer sheet 33 is aligned by rollers 34c, 34d and a resist gate 34e, the developer sheet 33 is fed into an inlet slot of the pressure developing unit 22.

The microcapsule sheet 11 and the developer sheet 33 are closely held against each other, when they are introduced into the pressure developing unit 22. The pressure developing unit 22 includes a small diameter roller 22a and a backup roller 22b. The microcapsule sheet 11 and the developer sheet 33 are sandwiched and pressed together between the small diameter roller 22a and the backup roller 22b. At this time, a microcapsule layer on the microcapsule sheet 11 with the latent image formed thereon and a color developer layer on the developer sheet 33 are held against each other. Those microcapsules in the microcapsule layer which are not exposed are ruptured under pressure, and developed images are transferred onto the developer sheet 33. The small diameter roller 22a and the backup roller 22b in the pressure developing unit 22 are also moveable to a position where they are spaced apart from each other so that they do not sandwich and pressurize the microcapsule sheet 11 and the developer sheet 33 when located therebetween. Thus, at least develloping unit 22 functions as developing means for developing the exposed photosensitive recording medium superposed with the developer recording medium.

The microcapsule sheet 11 and the developer sheet 33 which have left the pressure developing unit 22 are fed by the rollers 21c. Then, the microcapsule sheet 11 is separated from the developer sheet 33 by the separator portion 21d. The microcapsule sheet 11 is directed upwardly, whereas the developer sheet 33 travels straight ahead into a thermal fixing unit 35. Thus, at least separator portion 21d functions as means for separating the exposed photosensitive recording medium from the developer recording medium. The thermal fixing unit 35 includes a heater roller 35a and feed roller 35b. After color development on the developer sheet 33 is promoted and the color image is fixed by the heat fixing unit 35, the developer sheet 33 is discharged into a tray 36 with the developed image facing up.

The separated microcapsule sheet 11 travels past the adjustment roller 21e and is wound around the take-up reel 23.

The roller 21b is provided with a rotating plate 25c (not shown in FIG.1 but shown in FIG. 2) located in encoder 25 to detect the speed and the distance of the feeding of the microcapsule sheet 11 described in detail below.

Figure 5:
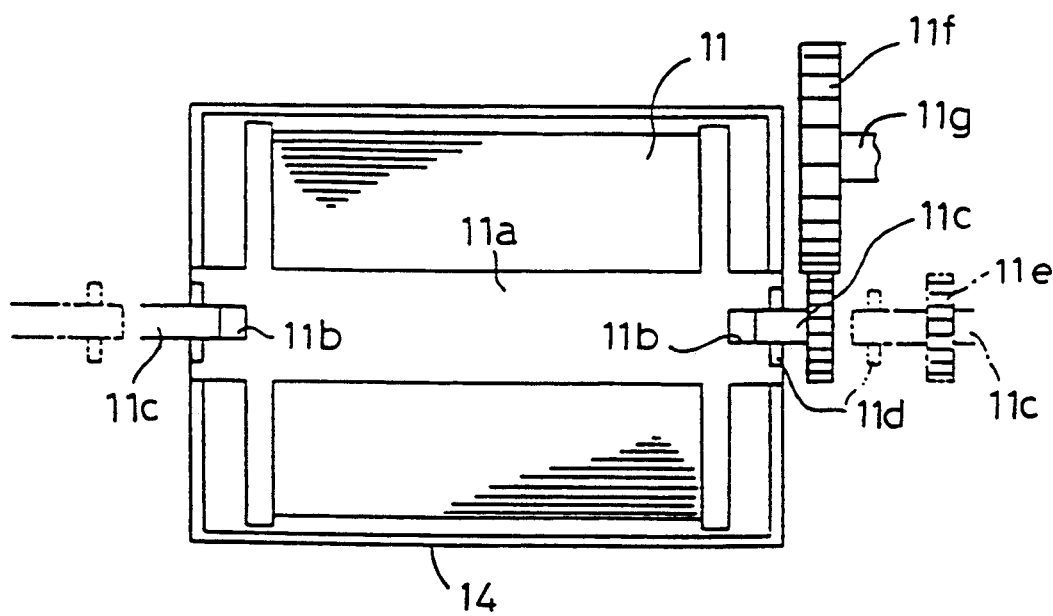
FIG. 5 a schematic view showing a cartridge and its associated mechanism.

As shown in FIG. 5, microcapsule sheet 11 is wound around the cartridge reel 11a in the cartridge 14. The cartridge reel 11a has a pair of grooves 11b at both sides thereof to engage with the cartridge support shafts 11c provided in the present machine 1. The cartridge support shafts 11c are constructed for movement back and forth toward and away from the pair of grooves 11b, when the cartridge 14 is placed in or removed from machine 1. The pair of cartridge support shafts 11c have a pair of the convex portions 11d which rotate the cartridge reel 11a when the pair of grooves 11b in the cartridge reel 11a are engaged by the convex portions 11d of the cartridge support shafts 11c. A transmitting gear 11e is provided on one of the cartridge support shafts 11c and is attached thereto for rotation with this cartridge support shaft 11c. A driving gear 11f, disposed near gear 11e is connected with a driving source 63B1 (not shown in FIG. 5) through driving shaft 11g, and is engageable with gear 11e. In this case, when the cartridge support shafts 11c are moved into the pair of grooves 11b and the pair of grooves 11b are engaged with the convex portions 11d, the cartridge reel 11a receives the driving force from driving source 63B1 through the driving gear 11f, the gear 11e, and the cartridge support shaft 11c.

Accordingly, when a cartridge 14 is placed in machine 1, and the cartridge shaft 11a is engaged with the pair of cartridge support shafts 11c, the cartridge shaft 11a is rotated clockwise or counterclockwise by the driving source 63B1 through the driving shaft 11g, , the driving gear 11f, the gear 11e, and the convex portions 11d so as to roll-up or unroll the microcapsule sheet 11 from around the cartridge shaft 11a.

There will next be described an arrangement of the controller 50, in the instant apparatus 1 by reference to the block diagram of FIG. 2.

The controller 50 includes an interface circuit 50e, and a main CPU (central processing unit) 50a, to which are connected through the interface circuit 50e, encoder 25, a control panel 61, sensors 62, the pressure developing unit 22, the thermal fixing unit 35, a sheet feeding unit 63, an exposure unit 64, an original support stand driver unit 65, an optical system driver unit 66 and a filter driver unit 67. The controller is connected with the main power source 50h to supply power to every component of copying machine 1.

The encoder 25 includes a rotating plate 25c having many slits disposed along a circumference thereof, a light-emitting element 25a for producing and directing a light beam toward the rotating plate 25c, and a light sensitive element 25b for receiving the light beam transmitted through slits of the rotating plate 25c, whereby the encoder 25 generates a pulse signal corresponding to the rotation of the rotating plate 25c based on the output of light sensitive element 25b. The light-emitting element 25a is connected to the main CPU 50a in controller 50 through a light-emitting element driver 50g. The main CPU 50a is also connected to the encoder 25 to receive the output of the encoder 25 through the interface 50e, and the main CPU 50a is adapted to count the number of pulses received from encoder 25 and to determine the amount and direction of the rotation of roller 21b based on the received pulse signals.

Control panel 61 has a start key 61a, a main battery key 61b to turn copying machine 1 on or off, a reset key 61c to reset the copying machine so that a copying operation can be performed after the photosensitive sheet has been placed inside cartridge 14, and other input keys 61d. Sensors 62 are disposed in the apparatus to transmit signals to CPU 50a for use in controlling the apparatus. Sheet feeding unit 63 has a developer sheet feeding portion 63A which controls the feeding of developer sheets 33, and a microcapsule sheet feeding portion 63B which controls the feeding of microcapsule sheet 11 and includes the driving source 63B1, and a separator roller driving portion 63C. Microcapsule sheet feeding portion 63B functions as, among other things, feeding means for feeding unused photosensitive recording medium which has been drawn out of cartridge 14 back toward outlet 15 so as to place unused photosensitive recording medium which has been drawn from the cartridge, back into the cartridge. Exposure unit 64 controls halogen lamp 5a (i.e., turns lamp 5a on and off) and also controls the light shielding cover 21g (i.e., moves cover 21g rightward and leftward to block or open the light path). Accordingly, at least exposure unit 64, and the elements which it controls (e.g., lamp 5a and light shielding cover 21g) comprises exposing means for exposing the photosensitive recording medium too form an image thereon. Original support stand driver unit 65 controls original support stand glass 2 to move back and forth. Optical system unit 66 controls lens 7 and mirrors 8,9 so that they are located in a suitable position. Filter driver unit 67 controls filter 6 so that it is located in a suitable position.

The CPU 50a is further connected to a ROM (read-only memory) 50b and a RAM (random-access memory) 50c. The RAM 50c acts as a work area for performing various types of processing and also stores data temporarily. ROM 50b stores various types of processing programs and stores initial data. CPU 50a operates to control the present copying apparatus 1, according to one or more control programs stored in the ROM 50b, while utilizing the temporary data storage function of RAM 50c. The auxiliary battery 51 is connected with an auxiliary CPU (central processing unit) 50f and the microcapsule sheet feeding unit 63B through the main CPU 50a and the interface circuit 50e so as to be able to supply power to feeding unit 63B and CPU 50a after power from main power source 50h has been turned off. Auxiliary CPU 50f measures time, prepares the data relating to current time (to be described below) and transmits this data to the main CPU 50a.

There will next be described an operation of the present apparatus 1. When a start key 61a in the control panel 61 is pressed, the stand glass 2 is moved rightward in FIG. 1 and brought to a stop at a position where the left end of the glass 2 is to be lighted by halogen lamp 5a. Then, the halogen lamp 5a is turned on, and the light emitted from the lamp 5a is reflected by the original 4 supported on the glass stand 2 and transmitted through the filter 6, the lens system 7 and the reflection mirrors 8,9 to form a latent image on the microcapsule sheet 11 at the exposure table 10.

With the leftward movement of the stand glass 2, the developer sheet 33 is picked up by the sheet feed mechanism 32 from the developer sheet cassette 31 and is laid upon the exposed part of the microcapsule sheet 11 to be fed to the pressure developing unit 22. The microcapsule sheet 11 and the developer sheet 33 are sandwiched and pressed together between the rollers 22a, 22b.

Immediately after the operation for forming the latent image has ended, the light shielding cover 21g starts to move leftward to prevent light from reaching exposure table 10. After the entire surface of the original 4 has been lighted and the light shielding cover 21g has blocked any additional light from reaching table 10, the stand glass 2 moves rightward with the halogen lamp 5a turning off.

The microcapsule sheet 11 and the developer sheet 33 which have left the pressure developing unit 22 are fed by rollers 21c. The microcapsule sheet 11 is separated from the developer sheet 33 by the separator roll 21d. The microcapsule sheet 11 is directed upwardly, whereas the developer sheet 33 travels ahead into the thermal fixing unit 35.

After color development on the developer sheet 33 is fixed by the thermal fixing unit 35, the developer sheet 33 is discharged into tray 36 with the developed image facing up. The separated microcapsule sheet 11 travels past the adjustment roller 21e and is wound around the take-up reel 23.

Figure 4:
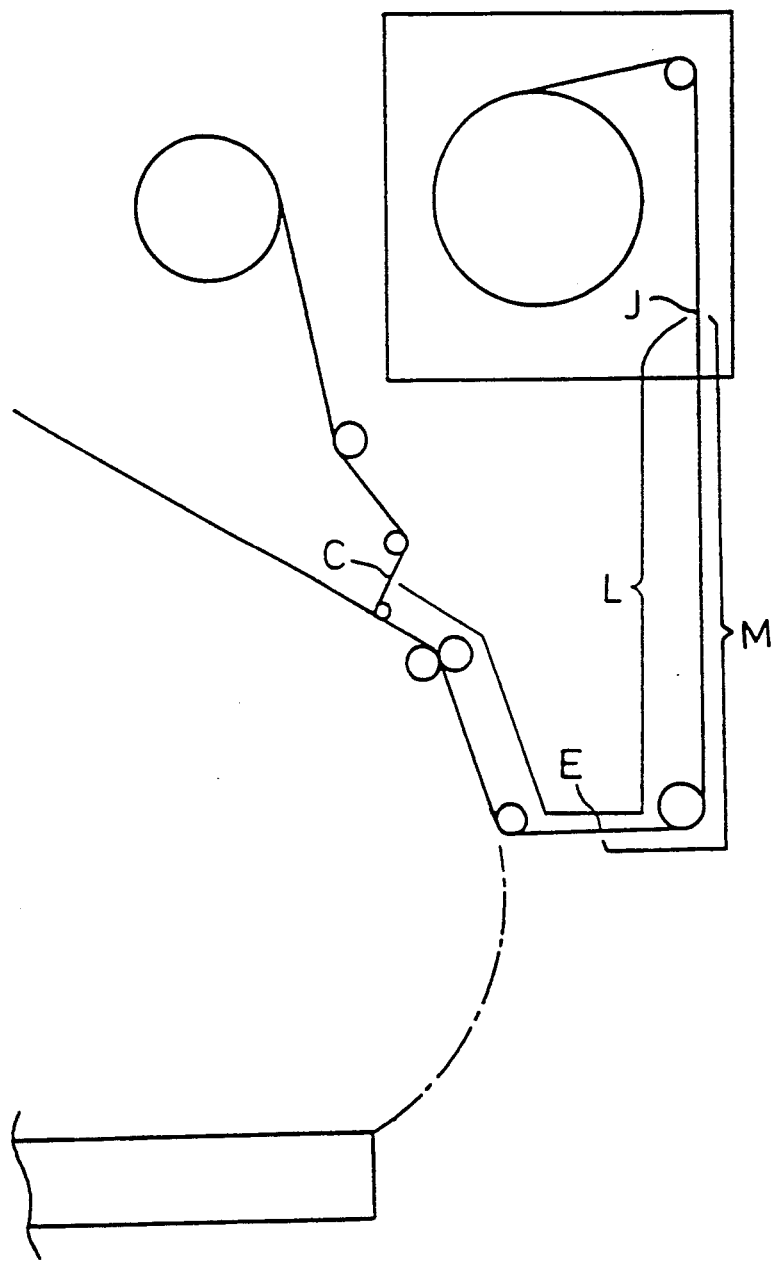
FIG. 4 is a diagram for explaining a control operation of the controller as shown in FIG. 2.

In this case, the trailing end of the exposed area of the microcapsule sheet 11 superposed with the developer sheet 33 passes through the separator roller 21d for a perfect separation from the developer sheet 33 and stops at a position C which is controlled to be spaced a short distance from the separator roller 21d along a microcapsule feeding path, as shown in FIGS. 1 and 4. Therefore, the leading end of the unused (unexposed) area following the used (exposed) area in the microcapsule sheet 11 is positioned at position C.

The microcapsule layer of the unused microcapsule sheet 11 which has been drawn out from cartridge 14 is exposed to air located in the copying machine 1 and is thus in danger of deterioration due to the influence of high temperature and high moisture in this air. The danger of deterioration is particularly acute in the case where the unused microcapsule sheet 11 has been exposed to this air for a long time, such as after the end of a copying operation. In order to prevent the unused microcapsule sheet 11 from deteriorating due to the influence of high temperature and high moisture which may exist outside of cartridge 14, the present copying machine rolls-up the unused microcapsule sheet 11 by the reel 11a so that the unused microcapsule sheet is re-located inside cartridge 14.

Figure 3A:
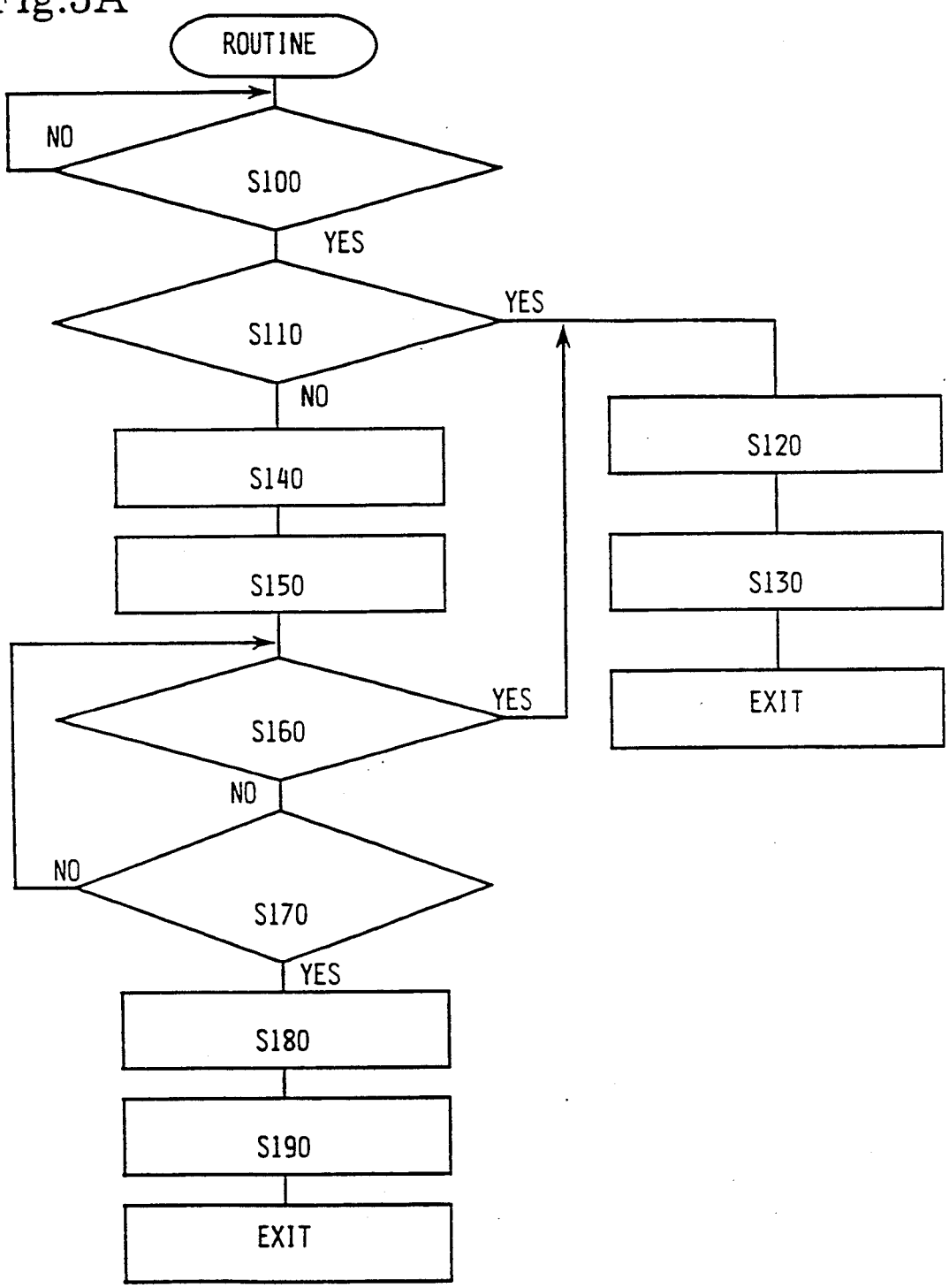

Next, a processing procedure of a routine relating to rolling up the unused microcapsule sheet 11 by reel 11a so that the unused microcapsule sheet 11 is placed back into cartridge 14 will be described in reference to the flow chart shown in FIGS. 3A and 3B. In this case, this routine is executed by the main CPU 50a and will be started when the copying operation is finished, (step 100). Hereinafter a step will be indicated simply by a reference S and following steps are indicated in a like manner.

If the copying operation is finished, main CPU 50a determines whether or not main power source 50h, which is used for copying, is switched off (S110). If the main CPU 50a determines that main power source 50h is switched off(YES at S110), main CPU 50a controls the pressure developing unit 22 so that small diameter roller 22a and back-up roller 22b are moved apart from each other (S120) and controls the feeding device to use power, supplied by the auxiliary battery 51, so that the microcapsule sheet 11 is fed by a predetermined amount L along the feeding path in order to place the unused (unexposed) portion of microcapsule sheet 11 into cartridge 14 (S130). It is understood that the pressure rollers 22a and 22b do not necessarily have to be moved apart. For example, if the normal operating position of rollers 22a and 22b is such that they are spaced apart from each other by a distance which is slightly greater than the thickness of the photosensitive sheet, yet less than the combined thickness of the photosensitive sheet and the developer sheet, rollers 22a and 22b do not need to be separated any further for rewinding the photosensitive sheet back into cartridge 14. See, for example, U.S. Pat. No. 4,901,103 the disclosure of which is herein incorporated by reference.

As shown in FIG. 4, the predetermined amount of feeding of the microcapsule sheet 11 along the feeding passage from position C to the position J located inside of cartridge 14 (distance L) is measured prior to manufacturing the copy machine, and the data relating to the distance L is stored in ROM 50b. Thus, ROM 50b functions as means for storing feeding distance L. The main CPU 50a determines the current feeding the feeding passage (the amount which microcapsule sheet has been fed toward cartridge 14 since starting this rewinding procedure) by counting the number of pulses generated by the encoder 25. The main CPU 50a compares the data relating to the distance L with the current feeding amount of microcapsule sheet 11 so as to stop the leading end of the unused portion of microcapsule sheet 11 at the predetermined position J. The measuring of the current feed amount can be performed any number of ways. For example, a counter (not shown) within CPU 50a can be reset to zero when the trailing edge of the exposed portion of photosensitive sheet 11 (and thus the leading edge of the unexposed portion thereof) reaches position C; as the photosensitive sheet 11 is being fed back into cartridge 14, the encoder pulse causes the value of the counter to increase; when the value of counter becomes equal to L, the entire unexposed portion of photosensitive sheet 11 is located within cartridge 14 and the rewinding operation is stopped. Therefore, the unused portion of microcapsule sheet 11 is placed in cartridge 14 for blocking the air in machine 1 from contacting the unused microcapsule sheet and thus can prevent the microcapsule sheet from deteriorating due to the influence of high temperature and high moisture.

If the main CPU 50a determines that main battery 50h continues to be switched on (NO at S110), it receives the data relating to the current time which auxiliary CPU 50f prepares and transmits to the main CPU 50a. Main CPU 50a stores this data as data relating to the time of ending of the previous copying operation in RAM 50c (S140). The main CPU 50a then begins an operation wherein the time period between the time when the previous copying operation ended and the current time is measured (S150). Thus, at least main CPU 50a functions as means for measuring a current time period equal to an amount of time since the previous image was recorded. The main CPU 50a monitors whether or not the main battery 50h has been switched off (S160) and if it determines that the main battery 50h has been switched off (YES at S160), it advances to S120. If the main CPU 50a determines that the main battery 50h continues to be switched on (NO at S160), it advances to S170. In S170, the main CPU 50a compares the data relating to the time period measured (in S150) with the data relating to a predetermined time period stored in ROM 50b. At least main CPU 50a also functions as means for comparing the predetermined time period with the current time period. This predetermined time period is determined so that the unused microcapsule sheet 11 is prevented from the possibility of deteriorating due to the influence of high temperature and high moisture. This predetermined time period can be, for example, one hour, however this time period is only an example and can vary depending on the type of photosensitive material used and the surrounding temperature and moisture conditions.

If the main CPU 50a determines that the predetermined time period has passed (YES at S170), it controls the pressure developing unit 22 so that small diameter roller 22a and back-up roller 22b are moved to be spaced apart from each other (S180) and controls the feeding device 63 so that the microcapsule sheet 11 is fed by the predetermined distance L backward along the feeding path in order to place the unused portion of microcapsule sheet 11 into cartridge 14 (S190). At this time, main CPU 50a has finished this routine. Accordingly, at least main CPU 50a functions as detecting means for detecting at least one of an expiration of a predetermined time period since a previous image was recorded and a switching-off of power to the image recording apparatus.

When the copying operation in this apparatus is resumed after the unused microcapsule sheet 11 has been placed into cartridge 14, an operator presses reset key 61c and then the main CPU 50a controls the microcapsule sheet feeding device 63B so that the leading edge of the unexposed area of the microcapsule sheet 11 is fed out of cartridge 14 and stopped at the position E confronting to an upstream side of the exposure table 10 shown in FIGS. 1 and 4 to resume the copying operation. That is, the microcapsule sheet 11 is fed by predetermined distance M from the position J to the position E described above. The predetermined distance M is measured prior to manufacturing copying machine 1. The data relating to the above-mentioned distance M is stored in ROM 50b. Thus, the CPU 50a controls the microcapsule sheet feeding device 63B to feed the microcapsule sheet 11 the predetermined distance M along the feeding passage. Thus, it is seen how controller 50 functions as control means for controlling the overall operation of the image recording apparatus, and as a feeding controlling means for controlling the feeding means (feeding portion 63B) to place the unused photosensitive recording medium into the cartridge 14 based on a detection made by main CPU 50a as to whether a predetermined time period since a previous image was recorded has passed or a switching-off of power has occurred.

As described above, the image recording apparatus comprises a cartridge 14 for accommodating the microcapsule sheet 11 including a peripheral wall 14a for blocking the passage of air into and out of cartridge 14, a reel 11a for rolling-up the unused microcapsule sheet 11, and an outlet 15 for drawing the microcapsule sheet 11 therefrom; a feeding unit 63B for feeding unused microcapsule sheet 11 which has been drawn out of the cartridge 14a so as to roll-up said unused microcapsule sheet 11 around said reel 11a for accommodating the unused microcapsule sheet 11 in the cartridge 14; a detecting unit (the main CPU 50a) for detecting at least one of the expiration of a predetermined time period since a previous copy was made and the switching-off of the power to the image recording machine 1; a feeding controlling unit (the main CPU 50a) for controlling the feeding means 63B to roll up the unused microcapsule sheet 11 around the reel 11a in the cartridge 14 based on the detection made by the detecting unit (the main CPU 50a).

As another embodiment, the exposing means is not constructed so that an original supported by a support stand glass is movable forth and back, and a light source is held at predetermined position, but instead is constructed so that an original supported by a support stand glass is held at a predetermined position and the light source is movable back and forth.

Also as another embodiment, the controller is not composed of two CPUs, but may be composed of one CPU.

As is apparent from this disclosure, many different embodiments of this invention may be made without departing from the spirit and scope thereof. It is to be understood that the scope of the present invention is not limited to the specific embodiments disclosed herein. Various modifications may be made without departing from the spirit and scope of the invention as defined in the appended claims.

What is claimed is:

1. An image recording apparatus for recording images on a continuous form photosensitive recording medium, the apparatus comprising:
   a cartridge for accommodating the photosensitive recording medium including: a peripheral wall for blocking flow of air into and out of said cartridge, supporting means for supporting unused photosensitive recording medium in said cartridge, and an outlet located in said peripheral wall for permitting passage of said photosensitive recording medium into and out of said cartridge;
   feeding means for feeding unused photosensitive recording medium which has been drawn out of said cartridge back toward said outlet of said cartridge so as to place substantially all of said unused photosensitive recording medium which has been drawn from said cartridge, back into said cartridge;
   feeding controlling means for controlling said feeding means, said feeding controlling means including:
     detecting means for detecting at least one of an expiration of a predetermined time period since a previous image was recorded and a switching-off of power to said image recording apparatus, said feeding controlling means controlling said feeding means to place substantially of said unused photosensitive recording medium in said cartridge based on a detection made by said detecting means; and
   an auxiliary power source, said feeding means being supplied with power by said auxiliary power source for feeding said unused photosensitive recording medium which has been drawn from said cartridge back into said cartridge when power to a main power source of said image recording apparatus has been switched off.

2. The image recording apparatus as defined in claim 1, wherein said detecting means comprises means for measuring a current time period equal to an amount of time since the previous image was recorded, and means for comparing said predetermined time period with said current time period.

3. The image recording apparatus as defined in claim 1, wherein said predetermined time period is determined so as to prevent an possibility of said unused photosensitive recording medium deteriorating.

4. The image recording apparatus as defined in claim 1, wherein said feeding controlling means comprises means for storing a feeding distance of the photosensitive recording medium along a feeding passage which is required to place said unused photosensitive recording medium which has been drawn from said cartridge back into said cartridge.

5. The image recording apparatus as defined in claim 1, wherein said cartridge further comprises means for sealing said outlet from -the passage of air therethrough while permitting said photosensitive recording medium to pass therethrough.

6. The image recording apparatus as defined in claim 5, wherein said means for sealing inhibits passage of heat and moisture into said cartridge while permitting photosensitive recording medium to pass therethrough without being damaged.

7. The image recording apparatus as defined in claim 3, wherein said predetermined time period is determined so as to prevent the possibility of said unexposed photosensitive recording medium deteriorating due to prolonged exposure to air located externally of said cartridge.

8. An image recording apparatus having a recording medium feeding path and comprising:
   a recording medium comprising an elongated continuous form photosensitive recording medium capable of receiving an image to be formed, and a cut sheet type of a developer recording medium which provides an output image upon reaction with the image formed on said photosensitive recording medium;
   a cartridge for accommodating the photosensitive recording medium including: a peripheral wall for blocking flow of air into and out of said cartridge, supporting means for supporting unexposed photosensitive recording medium in said cartridge, and an outlet located in said peripheral wall for drawing the photosensitive recording medium into and out of said cartridge;
   exposing means, located along said recording medium feeding path and having an exposure position, for exposing said elongated continuous form photosensitive recording medium so as to form an image thereon;
   developing means, disposed downstream of said exposing means with respect to said recording medium feeding path, for developing the exposed photosensitive recording medium superposed with the developer recording medium;
   separating means, disposed downstream of said developing means with respect to said recording medium feeding path, for separating said exposed photosensitive recording medium from said developer recording medium;

feeding means for feeding unexposed photosensitive recording medium which has been drawn out of said cartridge back toward said outlet of said cartridge too place substantially all of said unexposed photosensitive recording medium into said cartridge; and feeding controlling means for controlling said feeding means, said feeding controlling means including:

detecting means for detecting at least one of an expiration of a predetermined time period since a previous image was recorded and a switching-off of power to said image recording apparatus, said feeding controlling means controlling said feeding means to place substantially all of said unexposed photosensitive recording medium in said cartridge based on a detection made by said detecting means and;

an auxiliary power source, said feeding means being supplied with power by said auxiliary power source for feeding said unexposed photosensitive recording medium which has been drawn from said cartridge back into said cartridge when power to a main power source of said image recording apparatus has been switched-off.

9. The image recording apparatus as defined in claim 8, wherein said feeding controlling means controls said feeding means to feed a leading edge of an unexposed portion of said photosensitive recording medium from a position adjacent to said separating means to a position inside said cartridge.

10. The image recording apparatus as defined in claim 8, wherein said detecting means comprises means for measuring a current time period equal to an amount of time since the previous image was recorded, and comparing means for comparing said predetermined time period with said current time period.

11. The image recording apparatus as defined in claim 8, wherein the predetermined time period is determined so as to prevent a possibility of said photosensitive recording medium deteriorating.

12. The image recording apparatus as defined in claim 8, wherein said feeding controlling means includes means for storing a feeding distance of the photosensitive recording medium along said recording medium feeding path which is required to place said unexposed photosensitive recording medium which has been drawn from said cartridge back into the cartridge.

13. An image recording apparatus for recording images on a continuous form photosensitive recording medium which is supplied in a cartridge, the apparatus comprising:

means for receiving a cartridge of continuous form photosensitive recording medium;

feeding means for feeding continuous form photosensitive recording medium cartridge provided in a cartridge located in said means for receiving a cartridge out of and back into the cartridge;

feeding controlling means for controlling said feeding means so that said feeding means feeds the continuous form photosensitive recording medium from the cartridge located in said means for receiving a cartridge through said image recording apparatus so as to record images, and also controls said feeding means to feed substantially only an unrecorded portion of photosensitive recording medium which has been fed from the cartridge back into the cartridge after performing an image recording operation and;

an auxiliary power source, aid feeding means being supplied with power by said auxiliary power source for feeding said unrecorded photosensitive recording medium which has been drawn from said cartridge back into said cartridge when power to a main power source of said image recording apparatus has been switched-off.

14. The image recording apparatus as defined in claim 13, wherein said feeding controlling means controls said feeding means to feed the unrecorded portion of photosensitive recording medium back into the cartridge upon at least one of an expiration of a predetermined time period since a previous image was recorded and a switching-off of power too said image recording apparatus.

15. The image recording apparatus as defined in claim 1, said feeding controlling means further comprising:

detecting means for detecting at least one of the expiration of a predetermined time period since a previous image was recorded and the switching-off of power to said image recording apparatus; and wherein said feeding controlling means controls said feeding means to place said unrecorded photosensitive recording medium in said cartridge based on a detection made by said detecting means.

16. The image recording apparatus as defined in claim 15, wherein said detecting means comprises means for measuring a current time period equal to an amount of time since the previous image was recorded, and means for comparing said predetermined time period with said current.

17. The image recording apparatus as defined in claim 14, wherein said predetermined time period is determined so as to prevent a possibility of said unrecorded photosensitive recording medium deteriorating due to prolonged exposure to air located externally of said cartridge.

18. The image recording apparatus as defined in claim 15, wherein said feeding controlling means comprise means for storing a feeding distance of the photosensitive recording medium along a feeding passage which is required to place said unrecorded photosensitive recording medium which has been drawn from said cartridge back into said cartridge and wherein said feeding controlling means controls said feeding means to feed the unrecorded photosensitive recording medium back into the cartridge by said feeding distance.

19. The image recording apparatus as defined in claim 13, wherein said image recording apparatus includes a recording medium feeding path and further comprises:

exposing means, located along said recording medium feeding path and having an exposure position, for exposing the elongated continuous form photosensitive recording medium so as to form an image thereon;

developing means, disposed downstream of said exposing means with respect to said recording medium feeding path, for developing the exposed photosensitive recording medium superposed with a developer recording medium; and separating means, disposed downstream of said developing means with respect to said recording medium feeding path, for separating the exposed photosensitive recording medium from the developer recording medium;

wherein said feeding controlling means controls said feeding means to feed the unrecorded portion of photosensitive recording medium which has been fed from the cartridge back into the cartridge from a position downstream of said separating means.

* * * * *